(12) United States Patent
Yamane et al.

(10) Patent No.: US 6,181,590 B1
(45) Date of Patent: Jan. 30, 2001

(54) POWER INVERTER

(75) Inventors: Toshinori Yamane; Hirotoshi Maekawa, both of Tokyo (JP)

(73) Assignee: Mitsubishi Denki Kabushiki Kaisha, Tokyo (JP)

( * ) Notice: Under 35 U.S.C. 154(b), the term of this patent shall be extended for 0 days.

(21) Appl. No.: 09/436,025

(22) Filed: Nov. 8, 1999

(30) Foreign Application Priority Data

Jun. 4, 1999 (JP) .................................................. 11-158784

(51) Int. Cl.⁷ ................................................ H02M 1/5387
(52) U.S. Cl. .................................................................. 363/132
(58) Field of Search .................................. 363/16, 17, 40, 363/97, 98, 131, 132; 318/780, 781, 784, 794

(56) References Cited

U.S. PATENT DOCUMENTS

| | | | |
|---|---|---|---|
| 4,709,317 | * 11/1987 | Iizuka et al. ........................... | 363/37 |
| 5,583,385 | * 12/1996 | Horie et al. ........................... | 307/151 |
| 5,617,308 | * 4/1997 | Weise et al. ........................... | 363/98 |
| 5,933,331 | * 8/1999 | Boldin et al. ........................... | 363/16 |

FOREIGN PATENT DOCUMENTS 10-304680  11/1998  (JP) ................................ H02M/7/48

* cited by examiner

*Primary Examiner*—Matthew Nguyen
(74) *Attorney, Agent, or Firm*—Sughrue, Mion, Zinn, Macpeak & Seas, PLLC

(57) ABSTRACT

A small-sized highly reliable power inverter comprises switching elements for inverting power by switching, a drive circuit unit for driving the switching elements, smoothing capacitors for smoothing the output of a DC power source to be supplied to the switching elements, an insulated substrate for mounting the switching elements, a drive circuit board for mounting the drive circuit, and a smoothing capacitor substrate for mounting the smoothing capacitors between the insulated substrate and the drive circuit board, wherein ceramic capacitors are used as the smoothing capacitors and the smoothing capacitor substrate serves as an electromagnetic shielding plate.

9 Claims, 10 Drawing Sheets

POWER INVERTER

BACKGROUND OF THE INVENTION

1. Field of the Invention

The present invention relates to the arrangement and structure of smoothing capacitors in a power inverter such as an inverter.

2. Description of the Prior Art

FIG. 8 is a circuit block diagram of a power inverter for inverting DC power into 3-phase AC power to drive an AC load such as a 3-phase AC motor. In FIG. 8, reference numeral 1 denotes a DC power source for supplying a DC voltage, 2a relatively large-capacity smoothing capacitors for smoothing the voltage of the DC power source 1, 3 a DC input wire connected to the positive (P) sides of the DC power source 1 and the smoothing capacitors 2a, 4 a DC input wire connected to the negative (N) sides of the DC power source 1 and the smoothing capacitors 2a, 5a to 5c switching elements whose collectors are connected to the positive (P) DC input wire 3, and 5d to 5f switching elements whose collectors are connected to the respective emitters of the switching elements 5a to 5c and whose emitters are connected to the negative (N) DC input wire 4. Denoted by 6 is a drive circuit unit connected to the gates of the switching elements 5a to 5f to drive the switching elements 5a to 5f and 7 a control circuit unit for carrying out switching control by outputting a control signal to the drive circuit unit 6. DC power is inverted into 3-phase AC power by the switching operation of the switching elements 5a to 5f under the control of the control circuit unit 7. The switching elements 5a to 5f are transistors, IGBT's or MOSFET's.

Reference numeral 8 represents free wheel diodes whose cathodes are connected to the collectors of the switching elements 5a to 5f and whose anodes are connected to the emitters of the switching elements 5a to 5f to convert 3-phase AC power into DC power. Numeral 9 signifies snubber capacitors which are connected to the collectors of the switching elements 5a to 5f at one end and to the emitters of the switching elements 5a to 5f at the other end to suppress a surge generated in the switching elements 5a to 5d at the time of switching, 10u, 10v and 10w AC output wires connected between the switching elements 5a and 5d, between the switching elements 5b and 5e and between the switching elements 5c and 5f and to which inverted 3-phase (U-phase, V-phase, W-phase) AC power is output, and 11 an AC load, for example, a 3-phase AC motor connected to the AC output wires. The above DC input wires 3 and 4, the switching elements 5a to 5f, the drive circuit unit 6, the free wheel diodes 8, the snubber capacitors 9, and the AC output wires 10u, 10v and 10w constitute a switching power module 12.

The operation of the power inverter will be described hereinunder, taking an electric car as an example. When the car is started or accelerated, the power output of the DC power source 1 which is a battery is changed from DC power to 3-phase AC power to drive the AC load 11 which is a 3-phase AC motor. For the regenerative braking of the car, regenerative power from the AC load 11 is changed from 3-phase AC power to DC power to return it to the DC power source 1.

Since the main characteristics required for the snubber capacitors 9 are excellent frequency characteristics, a film capacitor is generally used as the snubber capacitor 9. The smoothing capacitors 2a suppress fluctuations in the voltage of the DC power source 1 and smoothens a voltage jump or the like. Since sufficiently large capacitance is required for this purpose, an aluminum electrolytic capacitor which can obtain large capacitance with ease is generally used. The control circuit unit 7 outputs a control signal to the drive circuit unit 6 of the switching power module 12 to control the switching elements 5a to 5f. The drive circuit unit 6 and the control circuit unit 7 are circuits for driving and controlling the AC load 11 such as an ordinary 3-phase AC motor or the like and hence, their illustrations are omitted.

FIG. 9 is a side view showing the internal configuration of a general power inverter and FIG. 10 is a plan view showing the internal configuration of the switching power module 12. In FIG. 9, reference numeral 13 denotes a plate-like cooling member, and 14 a case for covering the cooling member 13. The smoothing capacitors 2a, the switching power module 12, a snubber capacitor substrate 15 for mounting the snubber capacitors 9 and a control circuit board 16 for mounting the control circuit unit 7 are stored in the case 14.

The number of the smoothing capacitors 2a is 3 in this case. These smoothing capacitors 2a are aluminum electrolytic capacitors arranged in a row on the cooling member 13, and one end of a wiring board 17 is fixed and electrically connected to the top portion of each of the smoothing capacitors 2a by screws 17a. The other end of the wiring board 17 is fixed and electrically connected to the positive (P) and negative (N) DC input wires 3 and 4 of the switching power module 12 by a screw 18. This wiring board 17 is a copper bus bar, copper plate or the like used to connect the smoothing capacitors 2a to the switching power module 12.

Generally speaking, the snubber capacitor substrate 15 is arranged in the vicinity of the positive (P) and negative (N) DC input wires 3 and 4 and the U-phase, V-phase and W-phase AC output wires 10u, 10v and 10w on the switching power module 12 and fixed and electrically connected to the switching power module 12 by the screws 18.

The package of the switching power module 12 consists of a resin case 21 molded by inserting the positive (P) DC input wire 3, the negative (N) DC input wire 4, the U-phase, V-phase and W-phase AC output wires 10u, 10v and 10w and a drive circuit board connection wire 20, a cover 26 for covering the resin case 21 from above and a switching power module base plate 22.

The positive (P) and negative (N) DC input wires 3 and 4 are arranged in parallel as shown in FIG. 10 and connected to the U, V and W phases of AC output in most cases. Thereby, opposite-direction currents run through the positive (P) DC input wire 3 and the negative (N) DC input wire 4, and the inductance's of the wires offset each other by the mutual induction function of these currents, thereby reducing inductance between the positive (P) DC input wire 3 and the negative (N) DC input wire 4.

An insulated substrate 23 such as a ceramic substrate for mounting the switching elements 5a to 5f and the free wheel diodes 8 and a drive circuit board 24 for mounting the drive circuit unit 6 are stored in the package of the switching power module 12. The switching elements 5a to 5f and the free wheel diodes 8 are fixed on the switching power module base plate 22 through the insulated substrate 23 having a conductor pattern formed thereon by a bonding material such as solder and connected to the positive (P) DC input wire 3, the negative (N) DC input wire 4, the U-phase, V-phase and W-phase AC output wires 10u, 10v and 10w, and the drive circuit board connection wire 20 by a connection conductor 19 such as wire bonding or the like.

The drive circuit board 24 and the drive circuit board connection wire 20 are electrically connected to each other by solder or the like. A gel-like filler 25 is filled in a space between the insulated substrate 23 and the drive circuit board 24 and a resin such as an epoxy resin may be filled over the gel-like filler 25. The gel-like filler 25 protects the switching elements 5a to 5f, the free wheel diodes 8 and the connection conductor 19 to prevent the failure or malfunctioning of the switching elements 5a to 5f caused by moisture or dust. The under surface 24a on the insulated substrate side of the drive circuit board 24 is generally grounded to obtain an electromagnetic shielding effect so as to prevent the drive circuit unit 6 from malfunctioning by switching noise generated by the switching elements 5a to 5f at the time of power inversion. The cooling member 13 for cooling the switching elements 5a to 5f with air, water or oil is installed at the bottom of the case 14 to cool the switching elements 5a to 5f by radiating Joule heat generated from the switching elements 5a to 5f to the cooling member 13 through the insulated substrate 23 and the switching power module base plate 22. Detailed descriptions and illustrations of the installation position and fixing method of the control circuit board 16 are omitted.

SUMMARY OF THE INVENTION

Each of the smoothing capacitors 2a must have sufficiently large capacitance to smoothen the output of the DC power source 1 to be supplied to the switching elements 5a to 5f and thereby becomes large in size. When an aluminum electrolytic capacitor is used as the smoothing capacitor 2a, the quantity of heat generated in the inside of the smoothing capacitor 2a is increased by a current equivalent to a change in the ripple voltage of a DC current generated at the time of switching because the internal resistance of the capacitor is large. To suppress this heat generation, the smoothing capacitor 2a must be cooled by the above cooling member 13 with a complicated structure, or capacitance must be made large. To this end, in the prior art power inverter, the area and volume of the smoothing capacitor 2a become large, resulting in an increase in the size of the inverter. Further, the aluminum electrolytic capacitor has a narrow operation temperature range and a short service life due to the influence of leakage of an electrolyte caused by deterioration in sealing properties. Since the area and volume of the smoothing capacitor 2a are large, the length of the wiring board 17 for connecting the switching power module 12 and the smoothing capacitors 2a becomes large. Thereby, wire inductance between the switching elements 5a to 5f and the smoothing capacitors 2a become large, causing a possibility that the switching elements 5a to 5f may be destroyed by a big surge generated at the time of switching. Therefore, the snubber capacitors 9 must be installed in the vicinity of the DC input wires 3 and 4 and the AC output wires 10u, 10v and 10w of the switching power module 12. In the switching power module 12, electromagnetic shielding is effected by grounding the under surface 24a on the insulated substrate side of the drive circuit board 24 so as to prevent the drive circuit unit 6 from malfunctioning by radiation noise generated from the switching elements 5a to 5f. Therefore, parts can be mounted on only the upper side of the drive circuit board 24.

It is an object of the present invention which has been made to solve the above problems of the prior art to provide a small-sized highly reliable power inverter.

According to a first aspect of the present invention, there is provided a power inverter, wherein ceramic capacitors are used as smoothing capacitors.

According to a second aspect of the present invention, there is provided a power inverter, wherein a smoothing capacitor substrate serves as an electromagnetic shielding plate.

According to a third aspect of the present invention, there is provided a power inverter, wherein ceramic capacitors are used as smoothing capacitors and a smoothing capacitor substrate serves as an electromagnetic shielding plate.

According to a fourth aspect of the present invention, there is provided a power inverter, wherein two smoothing capacitor substrates are used, smoothing capacitors are mounted between the two smoothing capacitor substrates, the positive side of the DC power source is connected to the smoothing capacitor substrate on an insulated substrate side, and the negative side of the DC power source is connected to the smoothing capacitor substrate on a drive circuit board side.

According to a fifth aspect of the present invention, there is provided a power inverter, wherein dedicated wires connected to the positive and negative sides of the DC power source at one end and to the smoothing capacitor substrate at the other end and the smoothing capacitors are arranged at positions corresponding to the respective phases of AC output.

According to a sixth aspect of the present invention, there is provided a power inverter, wherein a screw for fixing the smoothing capacitor substrate is used to electrically connect the smoothing capacitor substrate to the positive and negative sides of the DC power source.

The above and other objects, features and advantages of the invention will become more apparent from the following description when taken in conjunction with the accompanying drawings.

BRIEF DESCRIPTION OF THE ACCOMPANYING DRAWINGS

DETAILED DESCRIPTION OF THE PREFERRED EMBODIMENTS

Preferred embodiments of the present invention will be described hereinunder with reference to the accompanying drawings.

Embodiment 1

Figure 1:
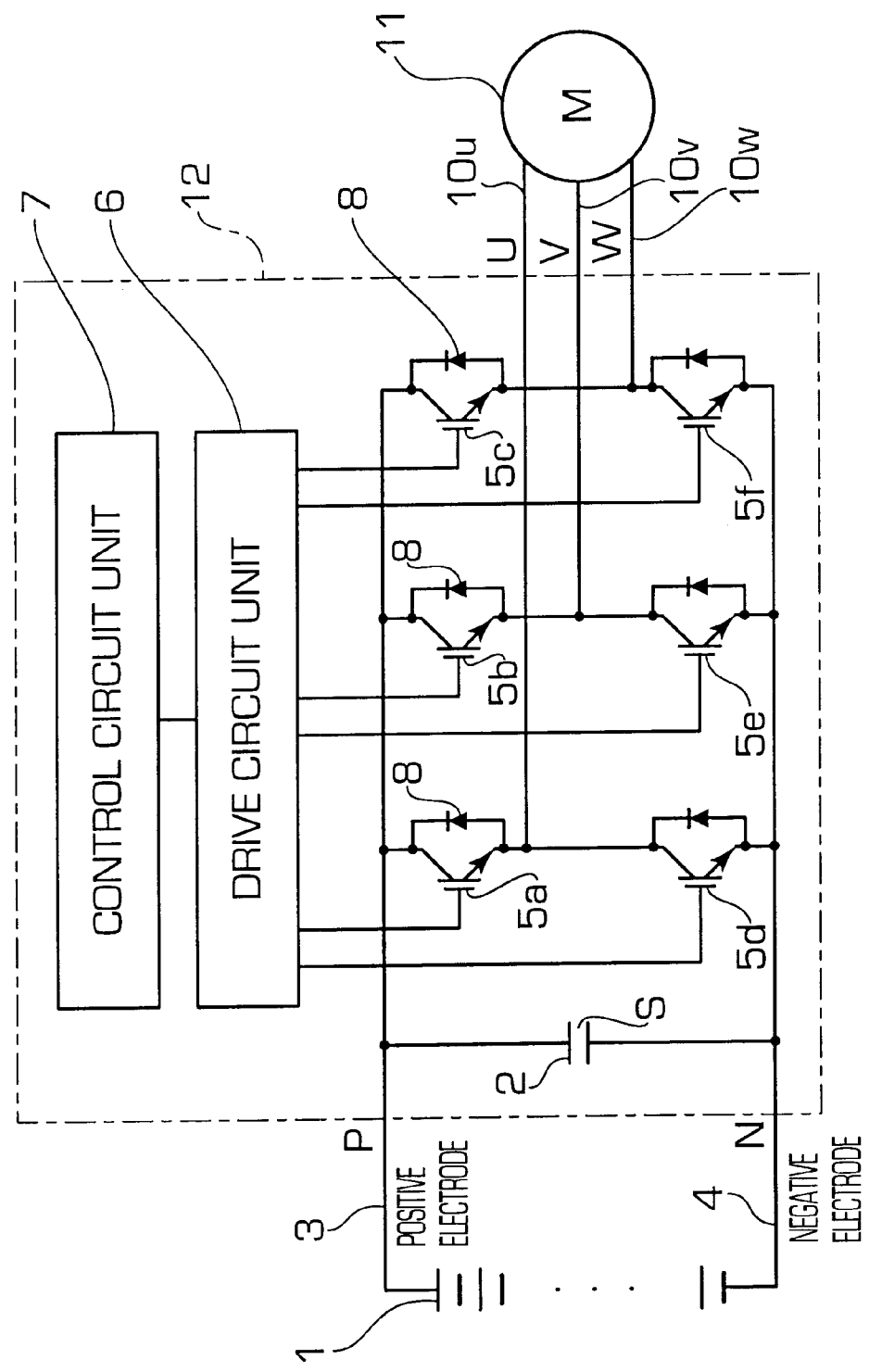
FIG. 1 is a block diagram showing the circuit configuration of a power inverter according to Embodiment 1 of the present invention.

An inverter for driving a 3-phase AC motor or the like according to Embodiment 1 of the present invention will be described hereinunder. However, it is to be understood that the present invention can be applied to all kinds of power inverters. The same or corresponding elements as those of the above prior art are given the same reference symbols and their descriptions are omitted. FIG. 1 is a circuit block diagram of a power inverter according to Embodiment 1 of the present invention, FIG. 2 is a side view showing the internal configuration of the power inverter according to Embodiment 1 of the present invention, and FIG. 3 is a plan view showing the internal configuration of a switching power module according to Embodiment 1 of the present invention.

Figure 8:
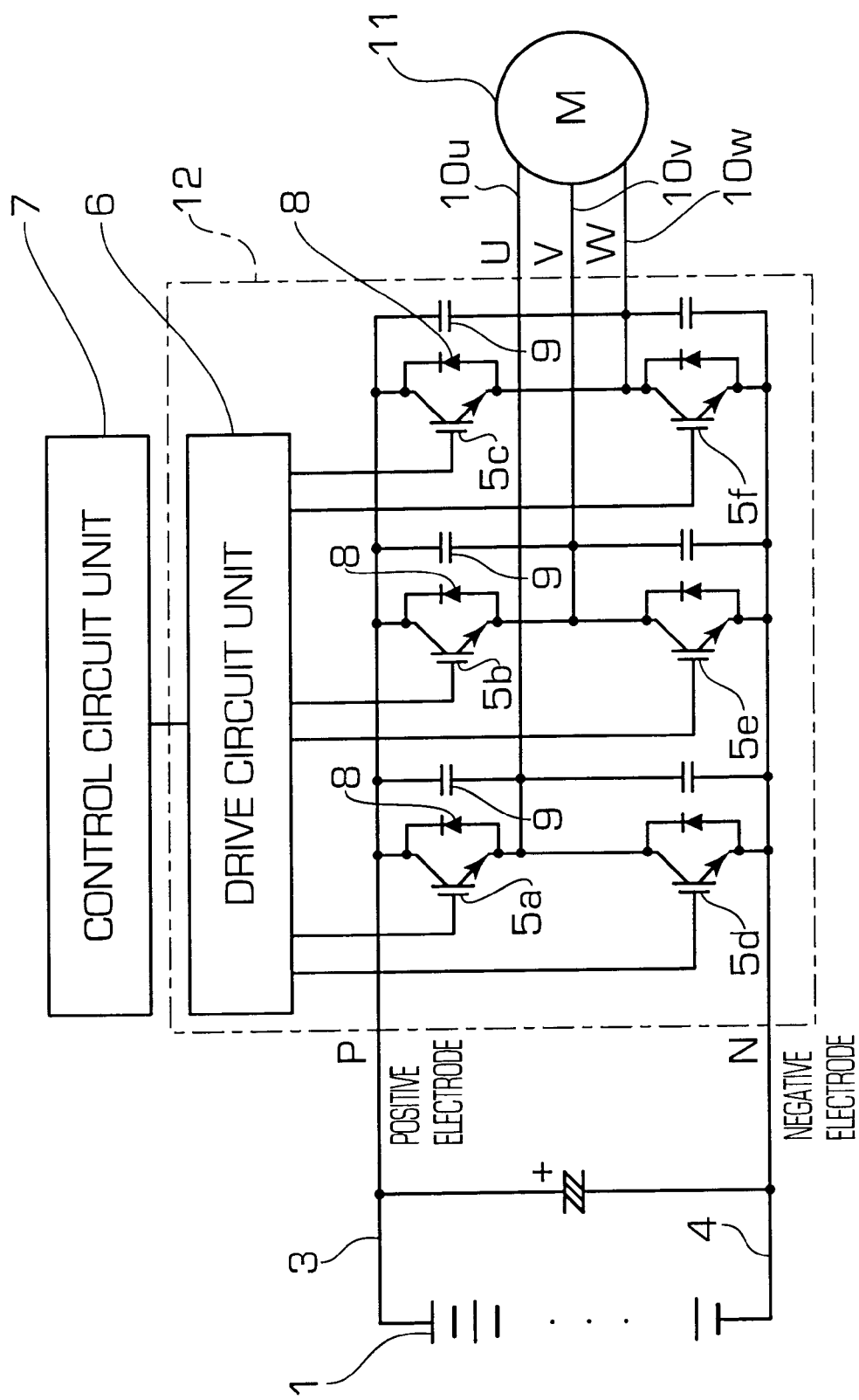
FIG. 8 is a block diagram showing the circuit configuration of a power inverter of the prior art.

As shown in FIG. 1, the present invention differs from the prior art shown in FIG. 8 in that ceramic capacitors S are used as smoothing capacitors 2 in place of the aluminum electrolytic capacitors of the prior art and incorporated in the switching power module 12, the snubber capacitors 9 are omitted, and the control circuit unit 7 is incorporated in the switching power module 12.

Figure 2:
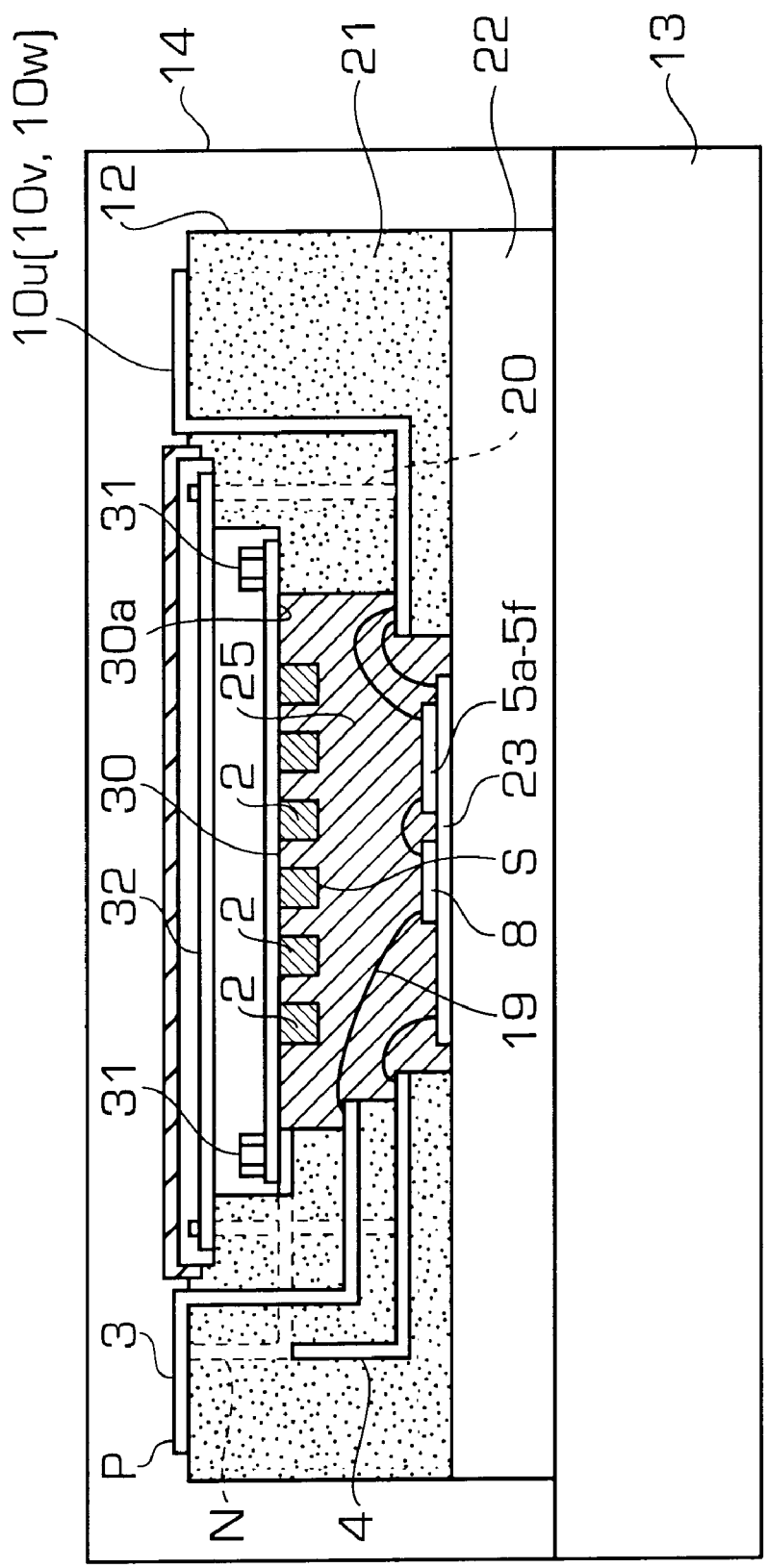
FIG. 2 is a side view showing the internal configuration of the power inverter according to Embodiment 1 of the present invention.
Figure 3:
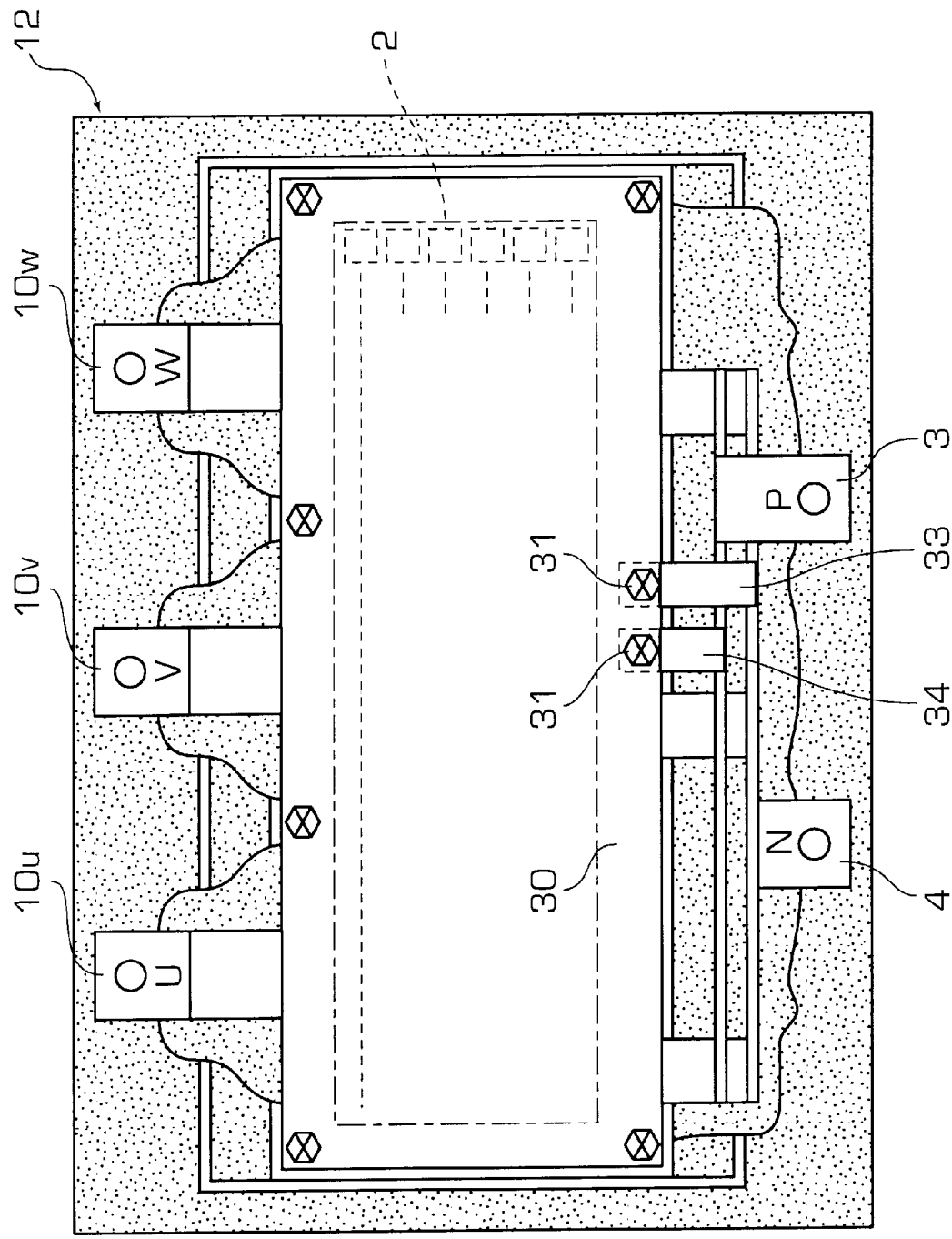
FIG. 3 is a plan view showing the internal configuration of a switching power module according to Embodiment 1 of the present invention.
Figure 9:
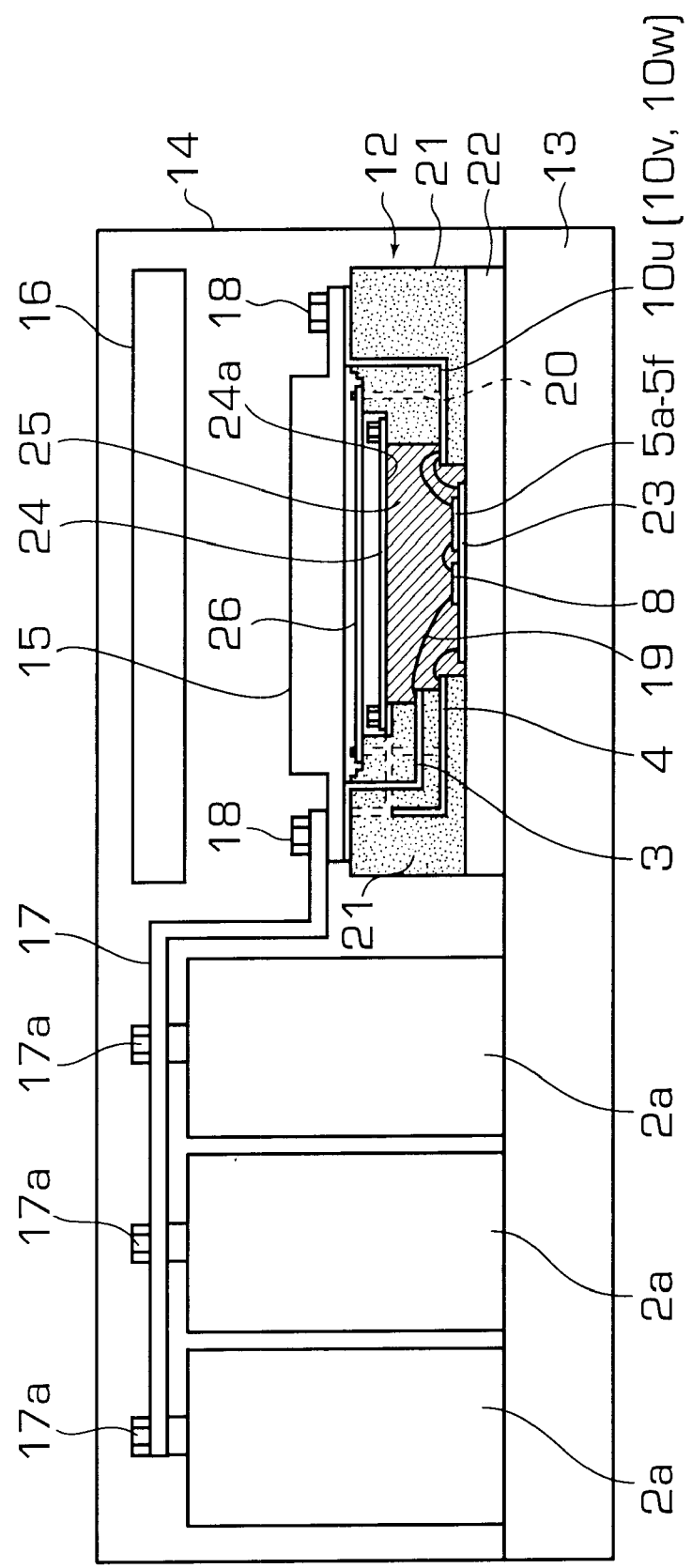
FIG. 9 is a side view showing the internal configuration of the power inverter of the prior art.
Figure 10:
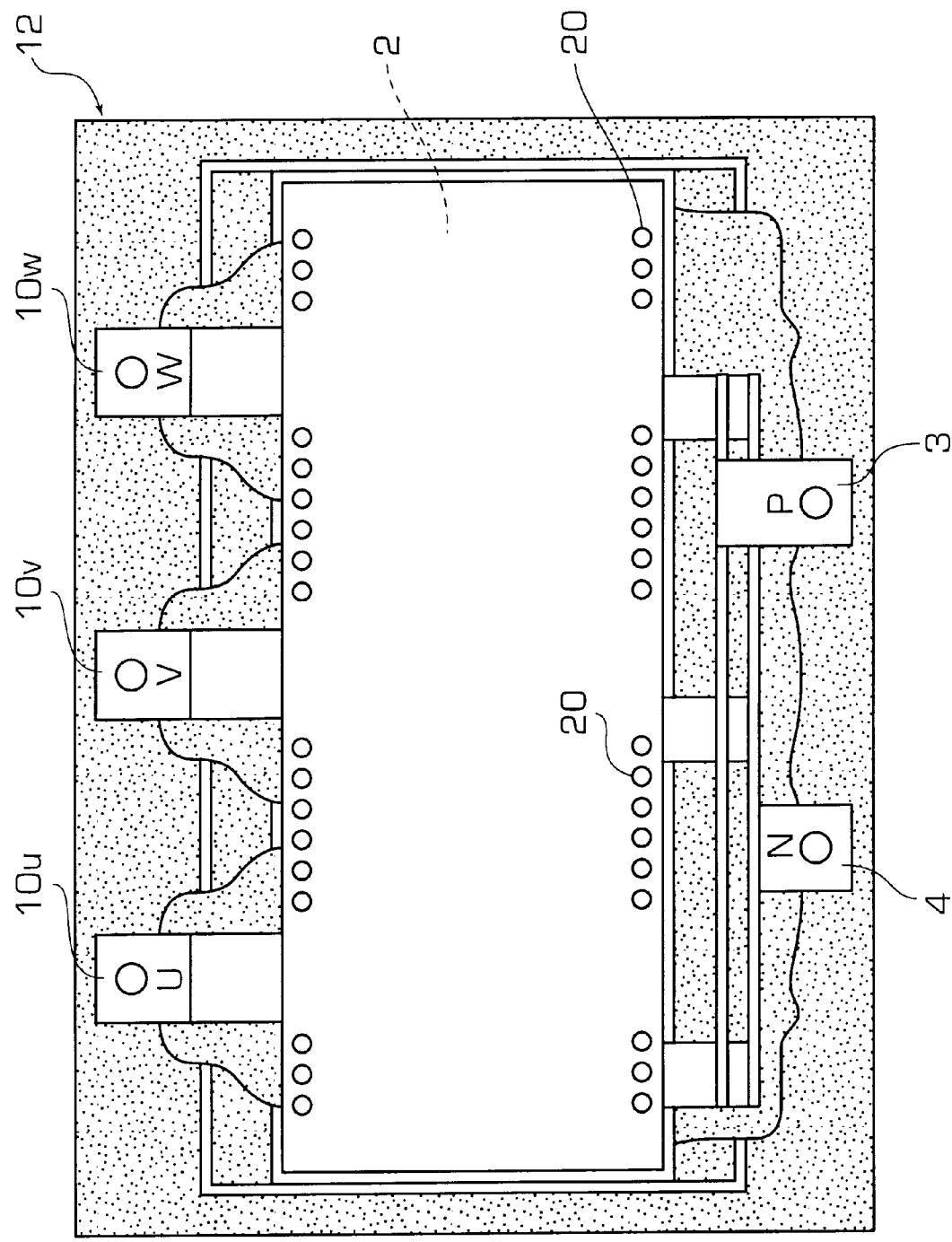
FIG. 10 is a plan view showing the internal configuration of a switching power module of the prior art.

As shown in FIG. 2, the present invention further differs from the prior art shown in FIG. 9 in that a smoothing capacitor substrate 30 having the smoothing capacitors 2 mounted on the under surface is added to the switching power module 12, arranged above the switching elements 5a to 5f and fixed at almost the central position of the resin case 21 by screws 31. This smoothing capacitor substrate 30 serves as an electromagnetic shielding plate whose top surface is covered with a copper foil for shielding switching noise from the switching elements 5a to 5f as will be described hereinafter.

A drive circuit board 32 having the control circuit unit 7 and the drive circuit unit 6 mounted on both sides is arranged above the smoothing capacitor substrate 30 and integrated as a control substrate for a power inverter, thereby eliminating the need for the control circuit board 16 of the prior art. That is, the smoothing capacitor substrate 30 having the ceramic capacitors S mounted thereon as the smoothing capacitors 2 is provided between the insulated substrate 23 having the switching elements 5a to 5f mounted thereon and the drive circuit board 32 and serves as an electromagnetic shielding plate.

The wiring board 17 and the screws 17a for connecting the switching power module 12 and the smoothing capacitors 2a in the prior art are omitted and the snubber capacitor substrate 15 is also omitted.

The ceramic capacitor S is used as the smoothing capacitor 2 which is a general-purpose surface mounting part and a plurality of the ceramic capacitors S are connected in parallel to ensure capacitance required for smoothing DC power. In this case, six ceramic capacitors are arranged in a row. The plurality of ceramic capacitors S are mounted on the under surface 30a on the insulated substrate side of the smoothing capacitor substrate 30.

Since the internal resistance and internal inductance of the ceramic capacitor S are about 1/10 those of the aluminum electrolytic capacitor used in the prior art, the capacitance of the ceramic capacitor S can be made much smaller than that of the aluminum electrolytic capacitor. Since the ceramic capacitor S as the smoothing capacitor 2 is made of a solid dielectric, it is free from the leakage of an electrolyte caused by deterioration in sealing properties and has a long service life. Although the internal resistance of the aluminum electrolytic capacitor of the prior art is large and the capacitance of the aluminum electrolytic capacitor must be made large to suppress the heat generation of the capacitor, the size of the power inverter can be reduced and the reliability of the power inverter can be improved by using the ceramic capacitor S. Further, wire inductance between the switching elements 5a to 5f and the smoothing capacitors 2 is reduced by incorporating the smoothing capacitors 2 in the switching power module 12 and a surge generated at the time of switching can be suppressed in the vicinity of the switching elements 5a to 5g by using the ceramic capacitors S having excellent frequency characteristics as the smoothing capacitors 2, thereby making it possible to omit the snubber capacitors 9 and the snubber capacitor substrate 15 which are required in the prior art. Since the surge is suppressed, the controllable range of the AC load 11 can be expanded by setting the power voltage of the DC power source 1 at a high level. Further, the switching elements 5a to 5g having low voltage resistance can be used owing to the suppression of a surge, thereby making it possible to reduce the size and cost of each of the switching elements 5a to 5f. Further the switching speed can be increased, a loss of each of the switching elements 5a to 5f can be reduced, and controllability can be improved and noise at the time of switching can be suppressed by setting the carrier frequency at a high level.

Besides the ceramic capacitor S, there is available a film capacitor as a capacitor made of a solid dielectric and having small internal resistance and excellent frequency characteristics. However, the film capacitor has a narrow operation temperature range whose upper limit is 105° C., compared with 125° C. of the ceramic capacitor S, thereby making it difficult to use it in the high-temperature operation environment of an automobile or the like. Generally speaking, the film capacitor has smaller capacitance per unit area and is larger in size than the ceramic capacitor S having the same capacitance as the film capacitor.

An inverter comprising ceramic capacitors S has already been disclosed by Japanese Laid-open Patent Application No. 10-304680. The present invention is characterized in that general-purpose surface mounting type ceramic capacitors S are mounted on the smoothing capacitor substrate 30 and the smoothing capacitor substrate 30 serves as an electromagnetic shielding plate as will be described hereinafter. Further, as will be described hereinafter, the present invention completely differs from the prior art in cooling means for suppressing the heat generation of the smoothing capacitor 2.

The smoothing capacitor substrate 30 is used to mount the smoothing capacitors 2 which are chip ceramic capacitors S as general-purpose surface mounting parts and serves as an electromagnetic shielding plate for preventing radiation noise generated from the switching elements 5a to 5f at the time of power inversion from transmitting to the drive circuit unit 6 and the control circuit unit 7. Stated more specifically, the surface opposite to the chip ceramic capacitor mounting surface of the smoothing capacitor substrate 30 is used as a power ground (N: negative) to obtain an electromagnetic shielding effect. A glass epoxy resin substrate covered with a copper foil may be used as the smoothing capacitor substrate 30 if it can be used to mount the smoothing capacitors 2 and shield switching noise to prevent the malfunctioning of the drive circuit unit 6 and the control circuit unit 7.

As already described in the section of the prior art, in the switching power module 12 of the prior art, shielding is effected by using the under surface 24a on the insulated substrate side of the drive circuit board 24 as a power ground to prevent the drive circuit unit 6 from malfunctioning by radiation noise generated from the switching elements 5a to 5*f* and hence, parts can be mounted on only one side of the drive circuit board 24. However, the above restriction is eliminated by providing the function of an electromagnetic shielding plate to the smoothing capacitor substrate 30, thereby making it possible to mount parts on both sides of the drive circuit board 32 and to mount both the drive circuit unit and the control circuit unit 7 as an integrated circuit with the result that a small-sized high-function power inverter can be obtained.

When the distance between the DC power source 1 and the power inverter is long or when the regenerative current di/dt of the AC load 11 must be made large according to a system to be constructed, the capacitance of the smoothing capacitor 2 must be further increased. In this case, the capacitance is increased by connecting an additional smoothing capacitor to the external output terminals of the positive (P) and negative (N) DC input wires 3 and 4 of the switching power module 12, thereby obtaining a large capacitance smoothing effect. The type of the additional smoothing capacitor to be connected to the external output terminals of the DC input wires 3 and 4 of the switching power module 12 is not limited to a ceramic capacitor S.

The smoothing capacitor 2 generates heat by a ripple current generated at the time of switching. Since the ceramic capacitor S having small internal resistance is used as the smoothing capacitor 2 in the present invention, the amount of heat generated by the smoothing capacitor 2 is smaller than that of the prior art. However, when the smoothing capacitor 2 is used in the high-temperature environment of an automobile or the like, the operation temperature margin becomes strict. That is, in this case, the capacitance of the smoothing capacitor 2 must be further increased, or cooling must be carried out by some means to suppress the heat generation of the smoothing capacitor 2.

The present invention makes effective use of the gel-like filler 25 for protecting the switching elements 5*a* to 5*f*, the free wheel diodes 8 and the connection conductor 19, which is filled in the space between the insulated substrate 23 and the smoothing capacitor substrate 30 in the switching power module 12. Stated more specifically, Joule heat generated from the smoothing capacitor 2 is transferred to the cooling member 13 for cooling the switching elements 5*a* to 5*f* in the switching power module 12 through the gel-like filler 25 to cool the switching elements 5*a* to 5*f*. This gel-like filler 25 is an insulating material having high heat conductivity.

As shown in FIG. 3, dedicated wires 33 and 34 connected to the positive (P) DC input wire 3 and the negative (N) DC input wire 4 at one end and to the smoothing capacitor substrate 30 at the other end are provided in the present invention and electrically connect the smoothing capacitor substrate 30 to the positive (P) DC input wire 3 and the negative (N) DC input wire 4 with screws 31 for fixing the smoothing capacitor substrate 30 on the other end side. That is, the positive (P) and the negative (N) sides of the DC power source 1 and the smoothing capacitor substrate 30 are electrically connected to each other and the smoothing capacitor substrate 30 is fixed to the resin case 20 by the screws 31. Thereby, they can be connected easily without waste and without fail. In FIG. 3, the drive circuit board 32 is omitted.

Figure 4:
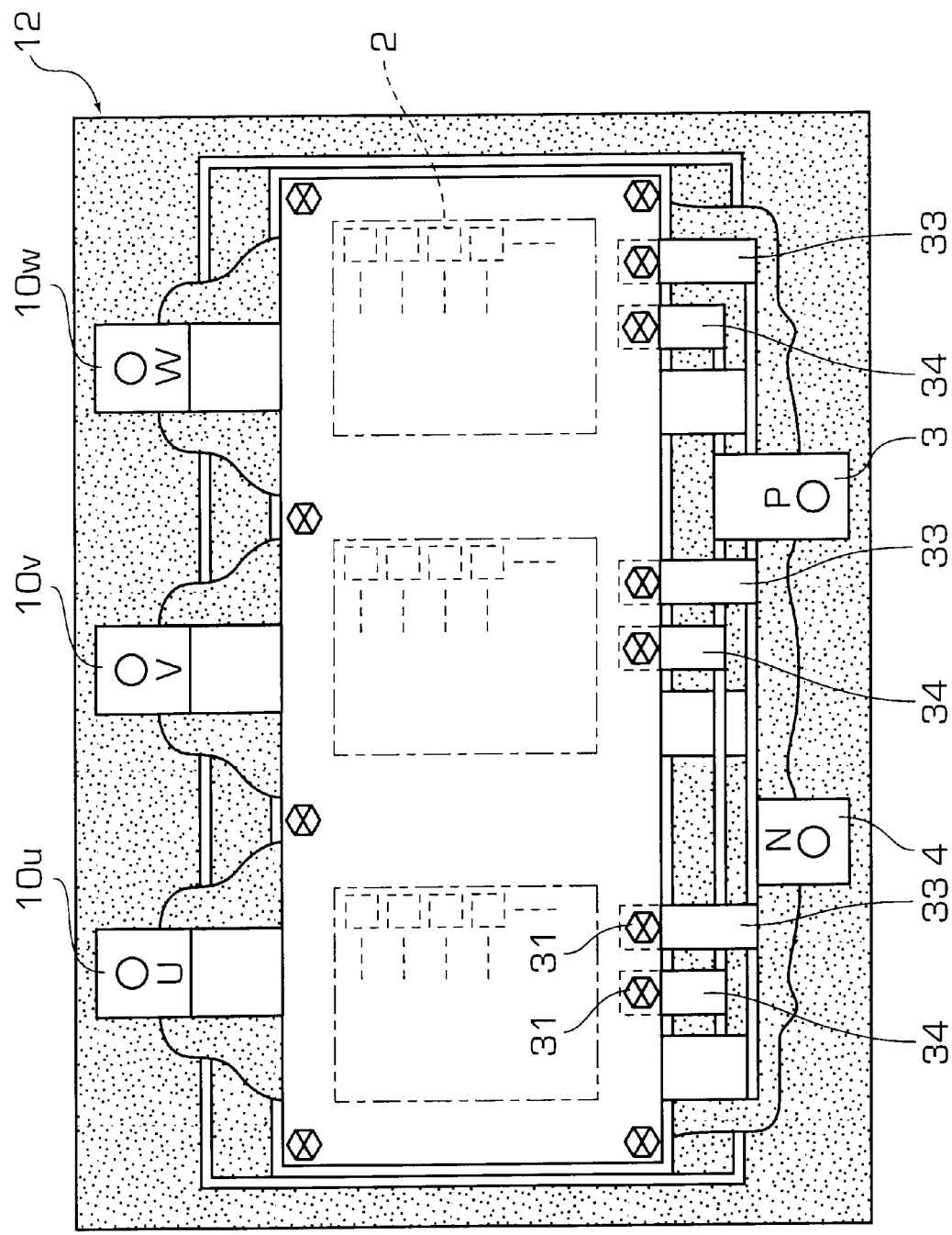
FIG. 4 is a plan view of a variation of the internal configuration of the switching power module according to Embodiment 1 of the present invention.

Three sets of the dedicated wires 33 and 34 and the smoothing capacitors 2 may be installed. That is, as shown in FIG. 4, three pairs of the dedicated wires 33 and 34 for connecting the positive (P) DC input wire 3, the negative (N) DC input wire 4 and the smoothing capacitor substrate 30 are provided and arranged separately at positions corresponding to the U, V and W phases of AC output, and three groups of the smoothing capacitors 2 to be mounted on the smoothing capacitor substrate 30 are arranged separately at positions corresponding to the above positions. Thereby, wire inductance between the switching elements 5*a* to 5*f* and the smoothing capacitors 2 for the U, V and W phases of AC output can be greatly reduced and a surge generated at the time of switching can be greatly suppressed. Further, the path of a transient current running at the time of switching becomes the shortest, thereby reducing switching noise.

Further, the smoothing capacitors 2 are arranged in the vicinity of the DC input wires 3 and 4 to minimize the length of a conductor pattern on the smoothing capacitor substrate 30 connected to the smoothing capacitors 2, whereby wire inductance between the switching elements 5*a* to 5*f* and the smoothing capacitors 2 is further reduced and the path of a transient current running at the time of switching is further shortened, thereby increasing the effect of reducing switching noise and suppressing a surge. In FIG. 4, the drive circuit board 32 is omitted.

Since the AC load 11 is a 3-phase AC motor, three sets of the dedicated wires 33 and 34 and the smoothing capacitors 2 are installed. When the AC load 11 is an AC motor, two sets or a plurality of sets of the dedicated wires 33 and 34 and the smoothing capacitors 2 may be installed.

Embodiment 2

Figure 5:
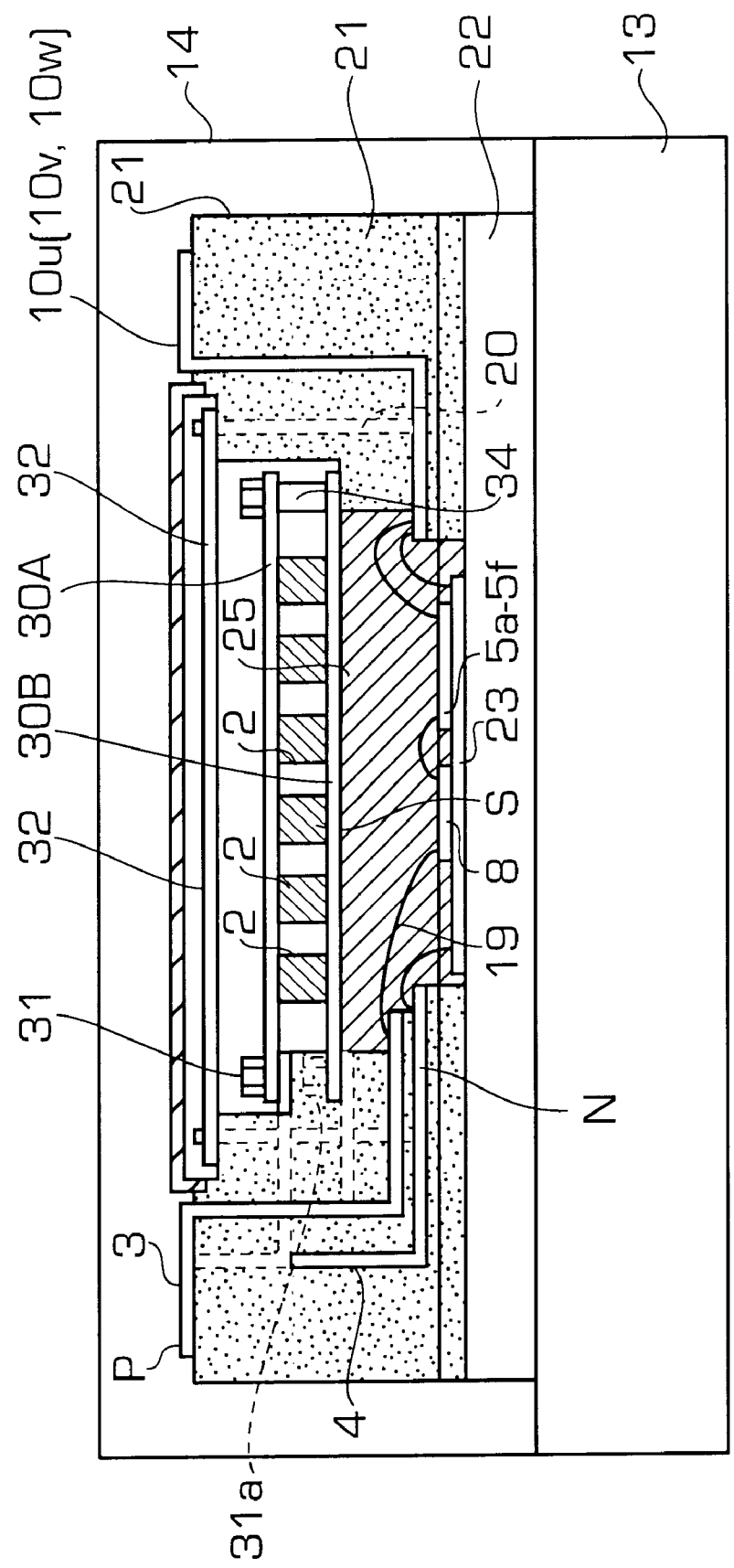
FIG. 5 is a side view showing the internal configuration of a power inverter according to Embodiment 2 of the present invention.
Figure 6:
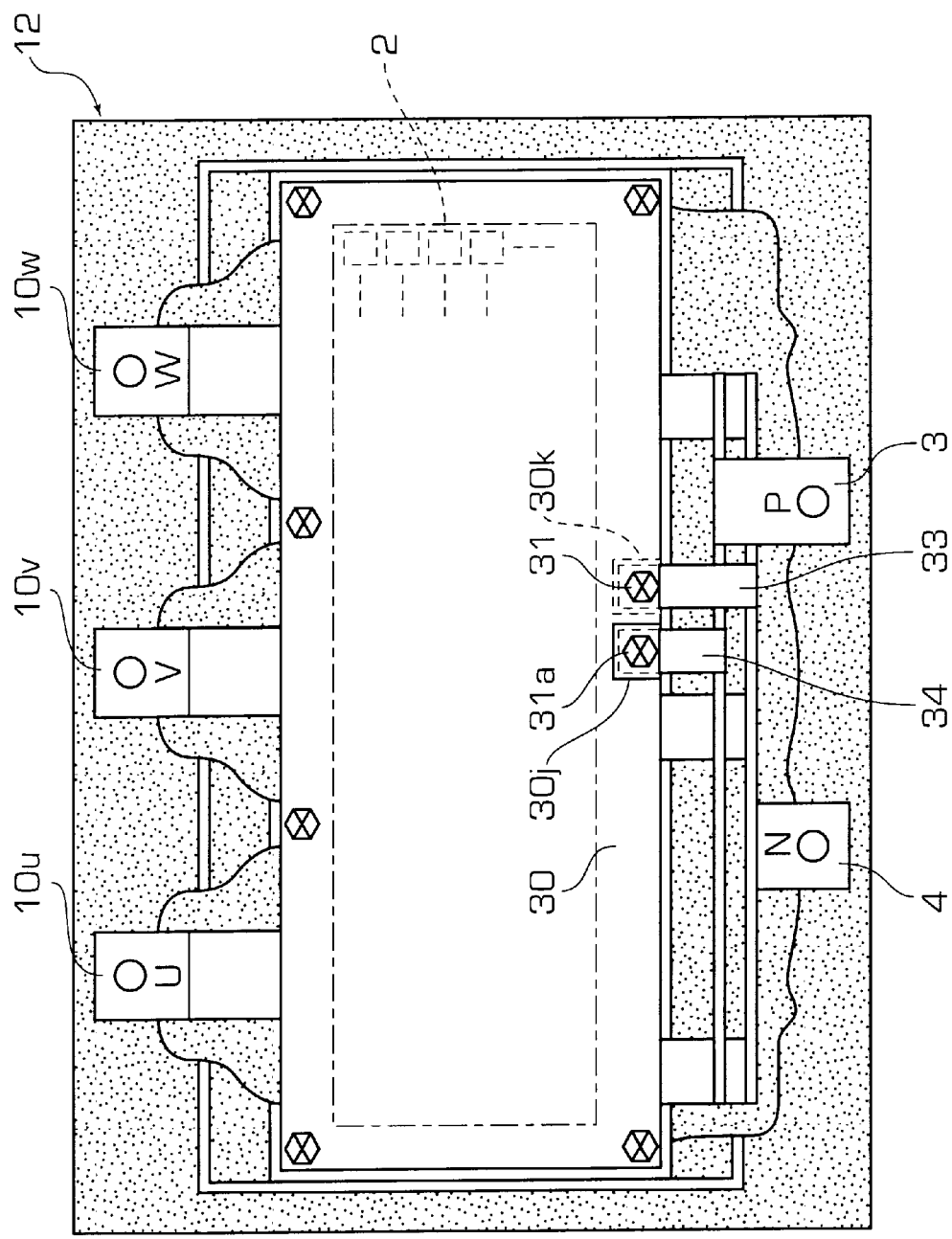
FIG. 6 is a plan view showing the internal configuration of a switching power module according to Embodiment 2 of the present invention.

FIG. 5 is a side view showing the internal configuration of a power inverter according to Embodiment 2 of the present invention, and FIG. 6 is a plan view showing the internal configuration of a switching power module according to Embodiment 2 of the present invention. The same or corresponding elements as those of Embodiment 1 are given the same reference symbols and their descriptions are omitted. In FIG. 6, the drive circuit board 32 is omitted.

In FIG. 5 and FIG. 6, two upper and lower smoothing capacitor substrates 30A and 30B are arranged above the switching elements 5*a* to 5*f* in place of the smoothing capacitor substrate 30 shown in FIG. 2. The entire top surface of the lower smoothing capacitor substrate 30B is covered with a conductor pattern, that is, a copper foil, and the positive (P) DC input wire 3 is connected to the conductor pattern. The entire under surface of the upper smoothing capacitor substrate 30A is covered with a conductor pattern, that is, a copper foil, and the negative (N) DC input wire 4 is connected to the conductor pattern. The smoothing capacitors 2 are mounted between the upper and lower smoothing capacitor substrates 30A and 30B. As will be described hereinafter, since the conductor pattern of the smoothing capacitor substrate 30A is connected to the negative (N) DC input wire 4, it functions as a ground and serves as an electromagnetic shielding plate.

That is, the smoothing capacitor substrate 30B on the insulated substrate 23 side is connected to the positive (P) DC input wire 3, and the smoothing capacitor substrate 30A on the drive circuit board 32 side is connected to the negative (N) DC input wire 4. The smoothing capacitor substrate 30A on the drive circuit board 32 side connected to the negative (N) DC input wire 4 serves as an electromagnetic shielding plate.

Since opposite-direction currents run through the conductor patterns formed on the upper and lower smoothing capacitor substrates 30A and 30B, the inductance's of the smoothing capacitor substrates 30A and 30B offset each other by the mutual induction function of these currents, thereby reducing the wire inductance's of the conductor patterns formed on the smoothing capacitor substrates 30A and 30B. In other words, wire inductance between the switching elements 5*a* to 5*f* and the smoothing capacitors 2 is reduced, thereby making it possible to suppress a surge generated at the time of switching. Since a solid conductor pattern is formed on the smoothing capacitor substrates 30A and 30B, a large number of smoothing capacitors 2 can be freely arranged, whereby the range of choice of capacitance is widened, the allowable current of the conductor pattern is increased, and the heat generation of the smoothing capacitors 2 and the conductor patterns can be suppressed.

As for the fixing of the upper and lower smoothing capacitor substrates 30A and 30B, a level difference is formed in the resin case 21 of the switching power module 12 at the DC input wire 3 and 4 connection portions of the smoothing capacitor substrates 30A and 30B, and a base 34 is provided between the upper and lower smoothing capacitor substrates 30A and 30B at another portion so that the upper and lower smoothing capacitor substrates 30A and 30B are fixed to the resin case 21 of the switching power module 12 by screws, thereby preventing the warp of the smoothing capacitor substrates 30A and 30B and fixing them with ease and certainty.

To enable the smoothing capacitor substrate 30B on the insulated substrate 23 side to be connected to the positive (P) DC input wire 3 by the screw, a cut-out 30j is formed in the connection portion of the upper smoothing capacitor substrate 30A so that the lower smoothing capacitor substrate 30B is fixed and electrically connected to the positive (P) DC input wire 3 by the screw 31a fit in this cut-out 30j. Further, to avoid the level difference formed in the resin case 21 of the switching power module 12, a cut-out 30k is formed in the connection portion of the smoothing capacitor substrate 30B so that the smoothing capacitor substrate 30A is fixed and electrically connected to the negative (N) DC input wire 4 by the screw 31.

Figure 7:
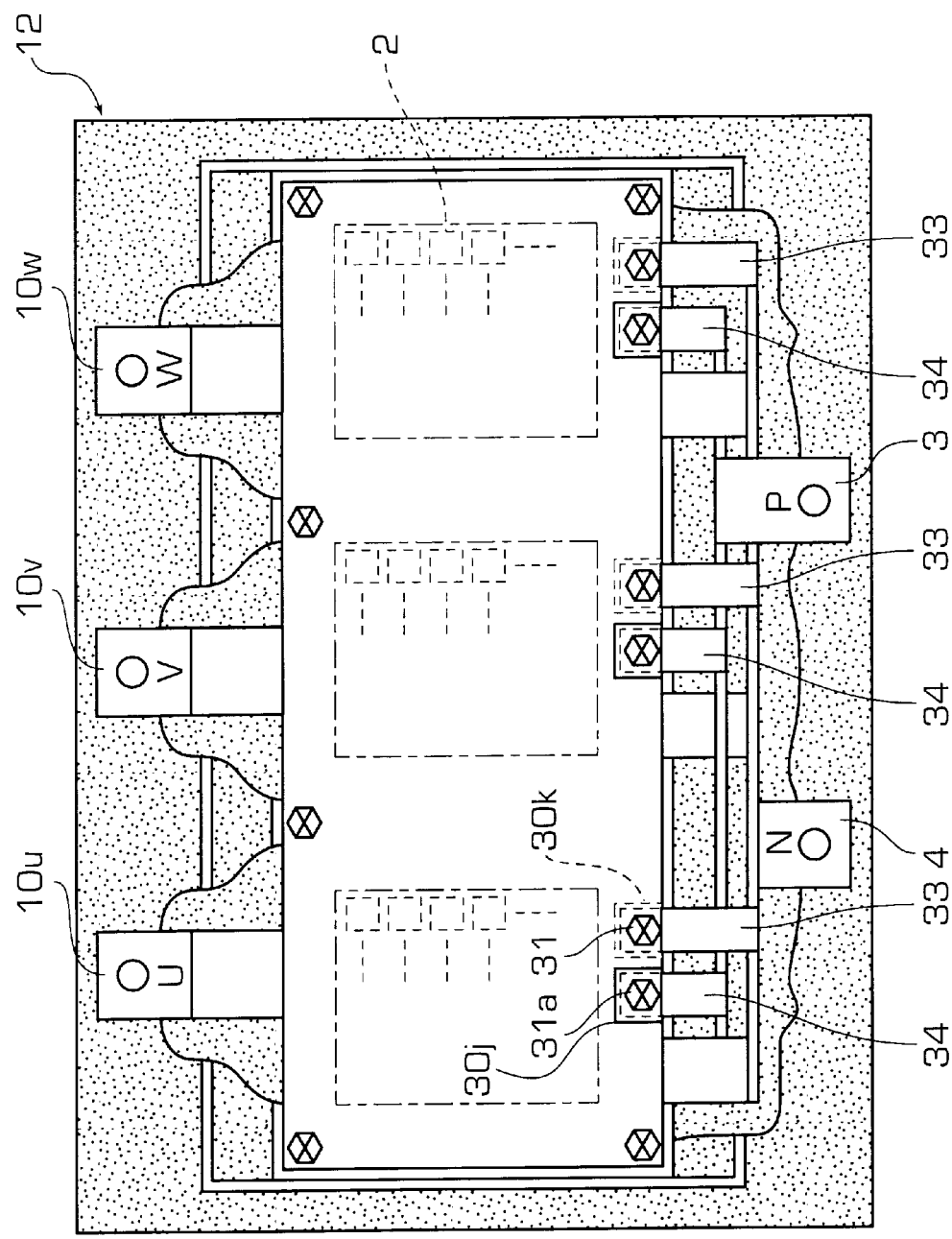
FIG. 7 is a plan view of a variation of the internal configuration of the switching power module according to Embodiment 2 of the present invention.

Also in this Embodiment 2, three sets of the dedicated wires 33 and 34 and the smoothing capacitors 2 may be installed. That is, as shown in FIG. 7, three pairs of the dedicated wires 33 and 34 for electrically connecting the positive (P) DC input wire 3, the negative (N) DC input wire 4 and the smoothing capacitor substrates 30A and 30B are provided and arranged separately at positions corresponding to the U,V and W phases of AC output and three groups of the smoothing capacitors 2 to be mounted on the smoothing capacitor substrates 30A and 30B are arranged at positions corresponding to these positions.

According to this embodiment, the same effect as described above can be obtained. That is, wire inductance between the switching elements 5a to 5f and the smoothing capacitors 2 for the U, V and W phases of AC output can be greatly reduced and a surge generated at the time of switching can be greatly suppressed.

Since the path of a transient current running at the time of switching becomes the shortest, switching noise is also reduced. Further, by arranging the smoothing capacitors 2 in the vicinity of the DC input wires 3 and 4, wire inductance between the switching elements 5a to 5f and the smoothing capacitors 2 is further reduced and the path of a transient current running at the time of switching is further shortened, thereby increasing the effect of suppressing a surge and the effect of reducing switching noise. In FIG. 7, the drive circuit board 32 is omitted.

As having been described above, according to the first aspect of the present invention, since the internal resistance and internal inductance of the ceramic capacitor used as the smoothing capacitor are much smaller than those of the aluminum electrolytic capacitor of the prior art, it is possible to greatly reduce capacitance and to reduce the size of the smoothing capacitor, that is, the size of the inverter. Since the smoothing capacitor is made of a solid dielectric, there is no possibility of the leakage of an electrolyte caused by deterioration in sealing properties, thereby improving reliability. Further, since the smoothing capacitors are incorporated in the switching power module, a wiring board and screws used to connect the switching power module to external smoothing capacitors can be omitted, thereby making it possible to greatly reduce the size of a power inverter. Since wire inductance between the switching elements and the smoothing capacitors can be reduced by incorporating the smoothing capacitors in the switching power module and a surge generated at the time of switching can be suppressed by using ceramic capacitors having excellent frequency characteristics as the smoothing capacitors, the snubber capacitors and the snubber capacitor substrate which are required in the prior art can be omitted. Further, the voltage resistance of the switching elements can be reduced, and the size and cost of the switching element can be reduced. Moreover, the controllable range of an AC load can be expanded by setting DC power voltage at a high level. A jump in DC power at the time of switching can be suppressed, thereby making it possible to increase switching speed and to reduce a loss of the switching element, and controllability is improved and noise generated at the time of switching can be suppressed by setting the carrier frequency at a high level.

According to the second aspect of the present invention, since the smoothing capacitor substrate for mounting the smoothing capacitors is used as an electromagnetic shielding plate for protecting the drive circuit unit and the control circuit unit from switching noise, it is possible to make effective use of the smoothing capacitor substrate and to mount parts on both sides of the drive circuit board of the prior art, whereby the size of the drive circuit board can be reduced and the number of functions can be increased by mounting both the drive circuit unit and the control circuit unit as an integrated circuit.

According to the third aspect of the present invention, since a ceramic capacitor is used as the smoothing capacitor and the smoothing capacitor substrate for mounting the smoothing capacitors is used as an electromagnetic shielding plate for protecting the drive circuit unit and the control circuit unit from switching noise, it is possible to reduce the size of the inverter, improve the reliability of the inverter and mount parts on both sides of the drive circuit board of the prior art, whereby the size of the drive circuit board can be reduced and the number of functions can be increased by mounting both the drive circuit unit and the control circuit unit as an integrated circuit.

According to the fourth aspect of the present invention, two smoothing capacitor substrates are used, smoothing capacitors are mounted between the two smoothing capacitor substrates, the smoothing capacitor substrate on the insulated substrate side is connected to the positive (P) side of the DC power source, and the smoothing capacitor substrate on the drive circuit board side is connected to the negative (N) side of the DC power source. Therefore, opposite-direction currents run through the smoothing capacitor substrates, and the inductance's of the smoothing capacitor substrates offset each other by the mutual induction function of these currents, whereby wire inductance between the switching elements and the smoothing capacitors can be reduced and a surge generated at the time of switching can be suppressed. Further, a large number of smoothing capacitors can be freely arranged by using the smoothing capacitor substrates having a solid conductor pattern formed thereon, thereby widening the range of choice of capacitance, increasing the allowable current of the conductor pattern and suppressing the heat generation of the smoothing capacitors and the conductor pattern.

According to the fifth aspect of the present invention, the dedicated wires connected to the positive and negative sides of the DC power source at one end and to the smoothing capacitor substrates at the other end and the smoothing capacitors are arranged separately at positions corresponding to AC output phases, thereby making it possible to greatly reduce wire inductance between the switching elements and the smoothing capacitors for the AC output phases and to greatly suppress a surge generated at the time of switching. Since the path of a transient current running at the time of switching becomes the shortest, switching noise is reduced as well.

According to the sixth aspect of the present invention, since a screw for fixing the smoothing capacitor substrate is used to electrically connect the smoothing capacitor substrate to the positive side and the negative side of the DC power source, electrical connection and fixing can be carried out with ease.

What is claimed is:

1. A power inverter comprising:

a plurality of switching elements for inverting power by switching;

a drive circuit unit for driving the switching elements;

a plurality of smoothing capacitors for smoothing the output of a DC power source to be supplied to the switching elements, wherein each of said smoothing capacitors comprises a ceramic capacitor;

an insulated substrate for mounting the switching elements;

a drive circuit board for mounting the drive circuit; and a smoothing capacitor substrate for mounting the smoothing capacitors between the insulated substrate and the drive circuit board.

2. A power inverter comprising:

a plurality of switching elements for inverting power by switching;

a drive circuit unit for driving the switching elements;

a plurality of smoothing capacitors for smoothing the output of a DC power source to be supplied to the switching elements;

an insulated substrate for mounting the switching elements;

a drive circuit board for mounting the drive circuit; and a smoothing capacitor substrate for mounting the smoothing capacitors between the insulated substrate and the drive circuit board, wherein the smoothing capacitor substrate serves as an electromagnetic shielding plate for shielding switching noise generated by the switching elements from the drive circuit unit.

3. A power inverter comprising:

a plurality of switching elements for inverting power by switching;

a drive circuit unit for driving the switching elements;

a plurality of smoothing capacitors for smoothing the output of a DC power source to be supplied to the switching elements, wherein each of said smoothing capacitors comprises a ceramic capacitor;

an insulated substrate for mounting the switching elements;

a drive circuit board for mounting the drive circuit unit; and a smoothing capacitor substrate for mounting the smoothing capacitors between the insulated substrate and the drive circuit board, wherein the smoothing capacitor substrate serves as an electromagnetic shielding plate for shielding switching noise generated by the switching elements from the drive circuit unit.

4. The power inverter of claim 1, wherein said smoothing capacitor substrate comprises first and second smoothing capacitor substrates between which the smoothing capacitors are mounted the first smoothing capacitor substrate being located between the second smoothing capacitor substrate and the insulated substrate and connected to a positive (P) side of the DC power source, and the second smoothing capacitor substrate being located between the first smoothing capacitor substrate and the drive circuit board and connected to a negative (N) side of the DC power source.

5. The power inverter of claim 1, further comprising dedicated wires connected to a positive (P) side and a negative (N) side of the DC power source to the smoothing capacitor substrate wherein the smoothing capacitors are arranged separately at positions corresponding to AC output phases.

6. The power inverter of claim 1, further comprising a screw for electrically connecting the smoothing capacitor substrate to a positive (P) side and a negative (N) side of the DC power source.

7. The power inverter of claim 1, further comprising a control circuit unit for generating a control signal which is supplied to the drive circuit unit for controlling the driving of the switching elements, wherein the control circuit unit is mounted on the drive circuit board.

8. The power inverter of claim 2, further comprising a control circuit unit for generating a control signal which is supplied to the drive circuit unit for controlling the driving of the switching elements, wherein the control circuit unit is mounted on the drive circuit board.

9. The power inverter of claim 3, further comprising a control circuit unit for generating a control signal which is supplied to the drive circuit unit for controlling the driving of the switching elements, wherein the control circuit unit is mounted on the drive circuit board.

* * * * *